United States Patent [19]

Schell

[11] 4,416,976
[45] Nov. 22, 1983

[54] DEVELOPER SOLUTION FOR THE DEVELOPMENT OF EXPOSED NEGATIVE-WORKING DIAZONIUM SALT LAYERS

[75] Inventor: Loni Schell, Hofheim, Fed. Rep. of Germany

[73] Assignee: Hoechst Aktiengesellschaft, Fed. Rep. of Germany

[21] Appl. No.: 249,617

[22] Filed: Mar. 31, 1981

[30] Foreign Application Priority Data

Mar. 31, 1980 [DE] Fed. Rep. of Germany ....... 3012522

[51] Int. Cl.³ .......................... G03C 5/34; G03C 5/00
[52] U.S. Cl. .................................... 430/331; 430/302; 430/309
[58] Field of Search ............... 430/331, 309, 637, 149, 430/493, 466, 329, 302

[56] References Cited

U.S. PATENT DOCUMENTS

| | | | |
|---|---|---|---|
| 3,475,171 | 10/1969 | Alles | 430/331 |
| 3,682,641 | 8/1972 | Casler et al. | 430/331 |
| 3,707,373 | 12/1972 | Martinson et al. | |
| 3,791,828 | 2/1974 | Moore et al. | 430/331 |
| 3,867,147 | 2/1975 | Teuscher | |
| 3,891,439 | 6/1975 | Katz et al. | 430/331 |
| 3,996,054 | 12/1976 | Santemma et al. | 430/493 |
| 4,055,515 | 10/1977 | Kirch | 430/331 |
| 4,267,260 | 5/1981 | Miura et al. | 430/309 |
| 4,271,261 | 6/1981 | Shimizu et al. | 430/309 |
| 4,308,340 | 12/1981 | Walls | 430/309 |

FOREIGN PATENT DOCUMENTS

| | | | |
|---|---|---|---|
| 1057105 | 6/1979 | Canada | |
| 1272868 | 5/1972 | United Kingdom | 430/331 |
| 1375673 | 11/1974 | United Kingdom | 430/149 |
| 1418433 | 12/1975 | United Kingdom | 430/149 |

OTHER PUBLICATIONS

Anon., "Glycol Ethers for Household and Institutional Products", Union Carbide, 1976, pp. 3-9.
Anon., "Glycol Ethers", Union Carbide, 1976, pp. 1 and 25.
Anon., "Collosolve, Carbitol, and Propasol Soluents for Coating Applications", Union Carbide, 1979, pp. 1-3, 6 and 10.

Primary Examiner—Charles L. Bowers, Jr.
Attorney, Agent, or Firm—James E. Bryan

[57] ABSTRACT

This invention relates to a developer solution for the development of exposed light-sensitive reproduction layers comprising a water-insoluble binder and a water-insoluble diazonium salt polycondensation product. As the essential constituents, this developer solution contains glycol ethers, glycol esters and water, in detail—about 30 to 80% of a compound of the formula

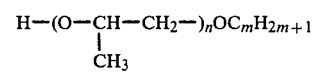

wherein n=1 to 4 and m=1 to 5; about 3 to 30% of a compound of the formula

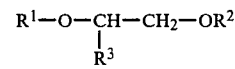

wherein $R^1$ and $R^2$ are acyl groups containing 1 to 4 carbon atoms, or one of the two groups is a hydrogen atom and $R^3$ is a hydrogen atom or a methyl group; about 0 to 15% of 1,3-dioxolane-2-one or 4-methyl-1,3-dioxolane-2-one; about 0 to 20% of a polyhydric alcohol; about 0 to 10% of an organic or inorganic salt which is soluble in the solvent mixture; and about 5 to 45% of water.

The invention relates further to a process for the development of negative-working reproduction layers based on (a) water-insoluble diazonium salt polycondensation products and (b) binders which are insoluble in water and in dilute aqueous alkaline solutions. In the process, the exposed reproduction layer is treated with the above-specified developer solution in order to dissolve the unexposed layer areas.

3 Claims, No Drawings

DEVELOPER SOLUTION FOR THE DEVELOPMENT OF EXPOSED NEGATIVE-WORKING DIAZONIUM SALT LAYERS

The present invention relates to a developer solution which is suitable for the development of negative-working exposed copying materials based on diazonium salt polycondensation products.

Copying materials of the above-defined type are preferably employed for the production of printing plates and also of photoresists and they comprise a layer support and a negative-working light-sensitive copying layer.

As the layer supports, metals, such as zinc, chromium, copper, brass, steel or aluminum, and plastic films, paper or the like are used, optionally after an appropriate pretreatment.

Suitable copying layers are those which are based on water-insoluble diazonium salt polycondensation products and on water-insoluble resins as binders, particularly resins which are insoluble even in weakly acid or alkalline aqueous solutions.

The developers for exposed copying layers of this kind normally require an addition of organic solvents. Developers which contain less than 50 percent by weight of an organic solvent, however, usually do not lead to a true dissolution of the unexposed layer areas, but merely detach these areas from the support in more or less large film-like pieces. If the copying layers are developed by hand using a sufficient excess quantity of developer, a cleanly developed image will normally result; but in that case, the consumption of expensive, organic solvent-containing developer is high and the removal or reprocessing of the developer involves additional work and cost.

Difficulties were particularly experienced in the development of heavy-duty printing plates of the above-described kind, if development was to be carried out in a continuous processor, because after a relatively short time, the insoluble constituent of the layer dispersed in the developer was deposited in the apparatus and sometimes even on the plates to be developed, thus rendering these plates useless.

Therefore, developers with higher contents of organic solvents (for example, at least 50 percent) were used for the development of reproduction layers of the above-described types (cf. German Offenlengungsschrift No. 2,024,244, Example 57). But even at such high contents of organic solvents, a residue of undissolved solid matter from the copying layer remains dispersed in the developer, in the case of layers which contain large quantities of water-insoluble binders. By adding relatively large quantities of wetting agents to the developer, a complete and stable dispersion and a clean development can be achieved, but it is, nevertheless, impossible to employ developers of the kind specified in the above-mentioned example in automatic processors, because these developers give rise to excessive foaming.

For layers of other kinds, developer solutions have been described which contain only a small proportion of water or even no water at all (cf. German Auslegeschrift No. 2,012,390). These developers also contain wetting agents and they are normally too aggressive for the development of printing plates of the above-mentioned composition.

In addition, Canadian Patent No. 1,057,105, discloses developers which are suitable for printing plates to be processed as described in the present invention and which contain up to 95 percent of organic solvents, for example, glycols or glycol ethers, and wetting agents. These developers are applied at temperatures ranging from 60° to 110° C. (see page 9, lines 6 to 7 and lines 17 to 18 of Canadian Patent No. 1,057,105). At these temperatures, the developers exhibit a strong foaming propensity if used in automatic processors.

It is therefore an object of the present invention to provide a developer solution for light-sensitive layers based on water-insoluble diazonium salt polycondensation products and water-insoluble binders, which ensures a complete dissolution of the unexposed layer areas and which is suitable for use in automatic processors.

The invention is based on a developer solution for the development of an exposed light-sensitive reproduction material containing a water-insoluble binder and a water-insoluble diazonium salt polycondensation product, the solution comprising as the essential constituents glycol ethers, glycol esters, and water.

An important feature of the developer solution according to the present invention is that it comprises 30 to 80 percent of a compound of the formula

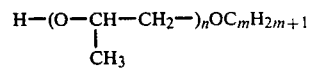

wherein $n = 1$ to 4 and $m = 1$ to 5; 3 to 30 percent of a compound of the formula

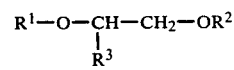

wherein $R^1$ and $R^2$ are acyl groups containing 1 to 4 carbon atoms or one of the two groups is a hydrogen atom and $R^3$ is a hydrogen atom or a methyl group, 0 to 15 percent of 1,3-dioxolane-2-one or 4-methyl-1,3-dioxolane-2-one, 0 to 20 percent of a polyhydric alcohol, 0 to 10 percent of an organic or inorganic salt which is soluble in the solvent mixture, and 5 to 45 percent of water.

The percentages given are by weight.

Reproduction materials which may be developed by means of the developer solutions of the present invention are, for example, described in German Offenlegungsschrift No. 2,024,244 (corresponding to U.S. Pat. No. 3,867,147).

The developers according to the present invention have a long useful life when employed in developing machines, because they ensure a practically complete dissolution of the layer components removed in the developing procedure and do not contain any low-boiling components. The organic components of the developer preferably have a boiling point above 100° C., particularly above 150° C.

The principal component of the developer according to the invention is a compound of the formula

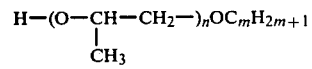

in which the symbols n and m have the above-mentioned meaning. Preferably n has a value of 1 to 3 and m a value of 1 to 3, particularly of 1. Glycol ether is generally present in a quantity of 30 to 80 percent by weight, preferably of 45 to 60 percent by weight of the solution.

A further indispensable component contained in the solution is a glycol ester of the formula

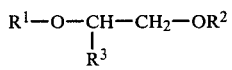

$$R^1-O-CH-CH_2-OR^2$$
$$\phantom{R^1-O-}|$$
$$\phantom{R^1-O-C}R^3$$

In the formula, the symbols $R^1$, $R^2$ and $R^3$ have the above-specified meaning.

Suitable glycol esters are, for example, ethylene glycol monoacetate and ethylene diacetate, ethylene glycol propionate or propanediol monoacetate. Ethylene glycol monoacetate and diacetate are preferred. The glycol ester may be contained in the solution in a quantity of 3 to 30 percent by weight, preferably of 10 to 20 percent by weight.

As further additions, dioxolane derivatives, for example, 1,3-dioxolane-2-one and 4-methyl-1,3-dioxolane-2-one, may be added to the solution in a quantity of up to 15 percent by weight, preferably of up to 8 percent by weight.

Moreover, higher molecular weight alcohols and glycol ethers, for example, tetrahydrofurfuryl alcohol, benzyl alcohol, 3-methoxy-butanol, diacetone alcohol, diethylene glycol monoethyl ether, ethylene glycol monophenyl ether and diethylene glycol dimethyl ether, are suitable for use as additional solvents.

It is also possible to add polyhydric alcohols which have a plasticizing effect, for example, glycerol, ethylene glycol or propylene glycol, in a quantity of 0 to 20 percent by weight, preferably of 3 to 15 percent by weight.

The developer solution additionally may contain inorganic or organic salts, for example, ammonium benzoate or sodium tartrate, lithium nitrate, strontium nitrate or magnesium sulfate, in a quantity which totals from 0 to 10 percent by weight.

In general, the developer of the present invention has a pH value ranging from 2 to 12, preferably from about 6 to 8, with the alkaline range being adjusted by one of the above-mentioned salts and the acid range preferably by an organic acid.

Low-boiling components are not contained in the developer according to the invention. Water which is present in a quantity of 5 to 45 percent by weight, preferably of 15 to 28 percent by weight, normally is the component which has the lowest boiling point.

During use, the developer therefore undergoes an insignificant change of composition only and its useful life in the machine is relatively long.

It is further a particular advantage of the developer that it does not require the addition of a wetting agent. It is fully effective at room temperature, but may, if necessary, also be employed at a slightly elevated temperature, for example at 40° C., without becoming unduly aggressive. At the usual application temperatures, hardly any unpleasant odors are given off.

In the following examples, preferred embodiments of the developer according to the present invention are described. Unless otherwise specified, the percentages and quantitative proportions given are to be understood as weight units.

EXAMPLE 1

An aluminum foil which had been roughened by brushing with an abrasive suspension was immersed for one minute in a water bath at 60° C. containing 0.3 percent of polyvinyl phosphonic acid, and was then dried.

The foil thus treated was coated with a solution of
- 0.7 part by weight of a polycondensation product prepared of 1 mole of 3-methoxydiphenylamine-4-diazonium sulfate and 1 mole of 4,4'-bis-methoxymethyl diphenylether in an 85% phosphoric acid and isolated as the mesitylene sulfonate,
- 3.4 parts by weight of an 85% phosphoric acid, and
- 3.0 parts by weight of the reaction product obtained by reacting an epoxy resin having a melting point of 70° C. and an epoxy equivalent weight of 459 with hydrochloric acid in ethylene glycol monomethyl ether (cf. German Offenlegungsschrift No. 2,034,654), in
- 60.0 parts by weight of ethylene glycol monomethyl ether,
- 20.0 parts by weight of tetrahydrofuran,
- 10.0 parts by weight of dimethyl formamide, and
- 10.0 parts by weight of butyl acetate, and was then dried. The light-sensitive material obtained was imagewise exposed and developed with a solution of the following composition:
- 60 parts by weight of propylene glycol monomethyl ether,
- 10 parts by weight of glycerol,
- 5 parts by weight of ethylene glycol acetate (mixture composed of 50% of monoacetate and 50% of diacetate),
- 5 parts by weight of sodium benzoate, and
- 20 parts by weight of water.

A perfect image was obtained.

EXAMPLE 2

An electrolytically roughened and anodically oxidized aluminum foil which had been after-treated with polyvinyl phosphonic acid as described in Example 1, was coated with the following solution:
- 1.6 parts by weight of polyvinyl formal,
- 0.5 part by weight of a polycondensation product of 1 mole of 3-methoxydiphenylamine-4-diazonium sulfate and 1 mole of 4,4'-bis-methoxymwethyl diphenyl ether, prepared in an 85% phosphoric acid at 40° C. and isolated as the mesitylene sulfonate,
- 0.05 part by weight of phosphoric acid and
- 0.3 part by weight of Hostapermblau ® in
- 57 parts by weight of ethylene glycol monomethyl ether,
- 30 parts by weight of tetrahydrofuran, and
- 8 parts by weight of butyl acetate and was then dried. The planographic printing plate thus obtained was exposed under an original and developed with a solution of
- 50 parts by weight of propylene glycol monomethyl ether,
- 15 parts by weight of ethylene glycol acetate (mixture of monoacetate and diacetate in the ratio of 1:1),
- 0.5 part by weight of 1,3-dioxolane-2-one,
- 1 part by weight of ammonium benzoate,
- 10 parts by weight of glycerol, and
- 23.5 parts by weight of water.

The image was cleanly and faultlessly developed and no film-like pieces formed of undissolved portions of the layer were observed.

It will be obvious to those skilled in the art that many modifications may be made within the scope of the present invention without departing from the spirit thereof, and the invention includes all such modifications.

What I claim is:

1. A developer solution for the development of exposed, light-sensitive reproduction layers which comprise a water-insoluble binder and a water-insoluble diazonium salt polycondensation product, the essential constituents of the solution being glycol ethers, glycol esters and water, and said solution consisting essentially of, by weight:

(a) 30 to 80 percent of a compound of the formula $$H-(O-CH(CH_3)-CH_2-)_n OC_m H_{2m+1}$$

wherein $n=1$ to 4 and $m=1$ to 5, (b) 3 to 30 percent of a compound of the formula $$R^1-O-CH(R^3)-CH_2-OR^2$$

wherein $R^1$ and $R^2$ are acyl groups containing 1 to 4 carbon atoms, or one of the two groups is a hydrogen atom and $R^3$ is a hydrogen atom or a methyl group, (c) 0 to 15 percent of 1,3-dioxolane-2-one or 4-methyl-1,3-dioxolane-2-one, (d) 0 to 20 percent of a polyhydric alcohol, (e) 0 to 10 percent of an organic or inorganic salt which is soluble in the solvent mixture, and (f) 5 to 45 percent of water.

2. A developer solution as claimed in claim 1 which has a pH between 12 and 2.

3. A developer solution as claimed in claim 1 which contains 0.5 to 8 percent by weight of an alkali salt or ammonium salt of an organic acid.

* * * * *